(12) United States Patent
Chew

(10) Patent No.: US 9,685,578 B2
(45) Date of Patent: Jun. 20, 2017

(54) PHOTOCOUPLER

(71) Applicant: Poh-Loong Chew, Grand Cayman (KY)

(72) Inventor: Poh-Loong Chew, Grand Cayman (MY)

(73) Assignee: Poh-Loong Chew, Grand Cayman (KY)

( * ) Notice: Subject to any disclaimer, the term of this patent is extended or adjusted under 35 U.S.C. 154(b) by 238 days.

(21) Appl. No.: 14/068,498

(22) Filed: Oct. 31, 2013

(65) Prior Publication Data

US 2015/0060706 A1 Mar. 5, 2015

(30) Foreign Application Priority Data

Aug. 28, 2013 (TW) .............................. 102130891 A

(51) Int. Cl.
*H01L 31/173* (2006.01)
*H01L 31/0232* (2014.01)

(52) U.S. Cl.
CPC ...... *H01L 31/173* (2013.01); *H01L 31/02325* (2013.01)

(58) Field of Classification Search
CPC ............. H01L 31/173; H01L 31/02325; H01L 31/167; H01L 31/16; H01L 31/0203; H01L 27/14618; H01L 31/0232; H01L 27/14625; H04B 1/587; H04B 10/802; H04B 10/801
USPC .......................... 250/551, 239; 257/687, 690
See application file for complete search history.

(56) References Cited

U.S. PATENT DOCUMENTS

| | | | | |
|---|---|---|---|---|
| 3,845,318 A | * | 10/1974 | Thillays | H01L 31/167 250/551 |
| 4,271,365 A | * | 6/1981 | Adams | H01L 31/16 250/551 |
| 4,292,735 A | * | 10/1981 | Thillays | B29D 11/00 250/551 |
| 4,712,017 A | * | 12/1987 | Kamasaki | H01L 31/0232 250/551 |
| 2002/0025593 A1 | * | 2/2002 | Matsuo | H01L 31/0203 438/31 |

(Continued)

OTHER PUBLICATIONS

Cantrell, M., "Use reinforced isolation for effective data couplers", Oct. 20, 2011, EDN Network; retrieved online Oct. 6, 2015.*

*Primary Examiner* — Francis M Legasse, Jr.
(74) *Attorney, Agent, or Firm* — The Webb Law Firm

(57) ABSTRACT

A photocoupler comprises a light emitting element, a light-sensing element, a transparent inner encapsulant body, an outer covering body, and two conductive frames. An optically reflective surface is formed on the outer covering body directly in contact with the dome encapsulant portion of the transparent inner encapsulant body. A portion of the light emitted by the light emitting element is reflected to the light-sensing element through the optically reflective surface, and the other portion of the light emitted from the light emitting element is directly emitting to the light-sensing element through the dome encapsulant portion. The present invention applies the optically reflective surface to minimize the overlapping area between the two conductive frames, and reduces the capacitance value, and increases the CMRR in a manner that the photocoupler of the present invention is able to meet the standard of electrical characteristics as required.

9 Claims, 1 Drawing Sheet

(56) References Cited

U.S. PATENT DOCUMENTS

| | | | |
|---|---|---|---|
| 2002/0031293 A1* | 3/2002 | Constantino | H01L 31/125 385/14 |
| 2011/0211790 A1* | 9/2011 | Kubota | H01L 25/167 385/39 |
| 2011/0235975 A1* | 9/2011 | Tay | G02B 6/4246 385/39 |

* cited by examiner

PHOTOCOUPLER

CROSS-REFERENCE TO RELATED APPLICATIONS

This application claims priority to Taiwan Patent Application No. 102130891, filed Aug. 28, 2013, the disclosure of which is hereby incorporated in its entirety by reference.

FIELD OF THE INVENTION

The present invention relates to an electronic component, and more particularly to a photocoupler.

BACKGROUND OF THE INVENTION

A photocoupler is a component that transfers electrical signals in the form of light between two isolated circuits. A conventional photocoupler generally includes two conductive frames, a light-sensing element provided on an upper surface of one conductive frame, and a light emitting element provided on a lower surface of the other conductive frame. The light emitting element is driven by an input electric signal to convert the input electric signal to a light signal, and the light-sensing element is for receiving the light signal and then outputting an electric signal converted from the light signal.

The photocoupler has been widely used in various electrical products. However, the electrical characteristics of the conventional photocoupler is unable to meet the required standard when the electrical characteristics of the photocoupler are affected due to a distance being too close between the two conductive frames, or an overlapping area being too large between the two conductive frames which will cause a large capacitance value and a low CMRR (Common Mode Rejection Ratio).

SUMMARY OF THE INVENTION

In view of the above circumstances, an object of the present invention is to provide a photocoupler that overcomes the drawbacks of large capacitance value and low CMRR as happens in the conventional photocoupler caused by the large overlapping area between the two conductive frames.

A photocoupler comprises a light emitting element for emitting a light; a light-sensing element for receiving the light; a transparent inner encapsulant body having a dome encapsulant portion and an extension encapsulant portion, wherein the dome encapsulant portion having a dome height is provided to encapsulate the light emitting element and the light-sensing element; an outer covering body for covering the transparent inner encapsulant body, wherein an optically reflective surface is formed on the outer covering body in contact with a dome surface of the dome encapsulant portion; and two conductive frames on which the light emitting element and the light-sensing element are respectively mounted, wherein the two conductive frames are respectively extending out of the outer covering body from the transparent inner encapsulant body, wherein the extension encapsulant portion is extendedly formed from the dome encapsulant portion in a direction from the optically reflective surface radially outward with an extending height being smaller than the dome height, the light emitting element and the light-sensing element are provided as facing the optically reflective surface, a portion of the light emitting from the light emitting element is reflected to a light receiving top portion of the light-sensing element through the optically reflective surface, and the other portion of the light emitting from the light emitting element is directly emitting to a light receiving side portion of the light-sensing element through the dome encapsulant portion along a direction which parallels to two surfaces of the two conductive frames on which the light emitting element and the light-sensing element are respectively mounted, the light-sensing element is configured to sense the light parallel to the two surfaces of the two conductive frames and the light reflected from the optically reflective surface, and a surface of the light receiving top portion is parallel to the surfaces of the conductive frames, and a surface of the light receiving side portion is perpendicular to the surfaces of the conductive frames.

According to an embodiment of the present invention, the light emitting element and the light-sensing element are respectively mounted on a first surface of the conductive frames, a second surface of the conductive frames is provided with a flat base portion formed of the same material as the dome encapsulant portion and the extension encapsulant portion, and the flat base portion has a flat base height smaller than the enclosed height.

According to an embodiment of the present invention, an external creepage distance of the photocoupler is larger than or equal to 8 mm.

According to an embodiment of the present invention, an internal creepage distance of the photocoupler is larger than or equal to 5 mm.

According to an embodiment of the present invention, an interval distance between the two conductive frames is in a range between 0.4 mm and 3 mm.

According to an embodiment of the present invention, further comprising a translucent sealant for covering a surface of the light emitting element.

According to an embodiment of the present invention, the translucent sealant is formed of silicone.

According to an embodiment of the present invention, the light emitting element is an infrared light emitting diode.

According to an embodiment of the present invention, the extending height is a fixed value.

The present invention applies the optically reflective surface to reflect the light from the light emitting element to the light-sensing element, minimizes the overlapping area between the two conductive frames, reduces the capacitance value, and increases the CMRR in a manner that the photo coupler of the present invention is able to meet the standard of electrical characteristics as required.

BRIEF DESCRIPTION OF THE DRAWINGS

The structure and the technical means adopted by the present invention to achieve the above and other objects can be best understood by referring to the following detailed description of the preferred embodiments and the accompanying drawings.

DETAILED DESCRIPTION OF THE PREFERRED EMBODIMENTS

The embodiment is described in detail below with reference to the FIG. 1 and FIG. 2, and the description is only for explaining the embodiment of the present invention, but not for limiting the scope of the present invention.

Figure 1:
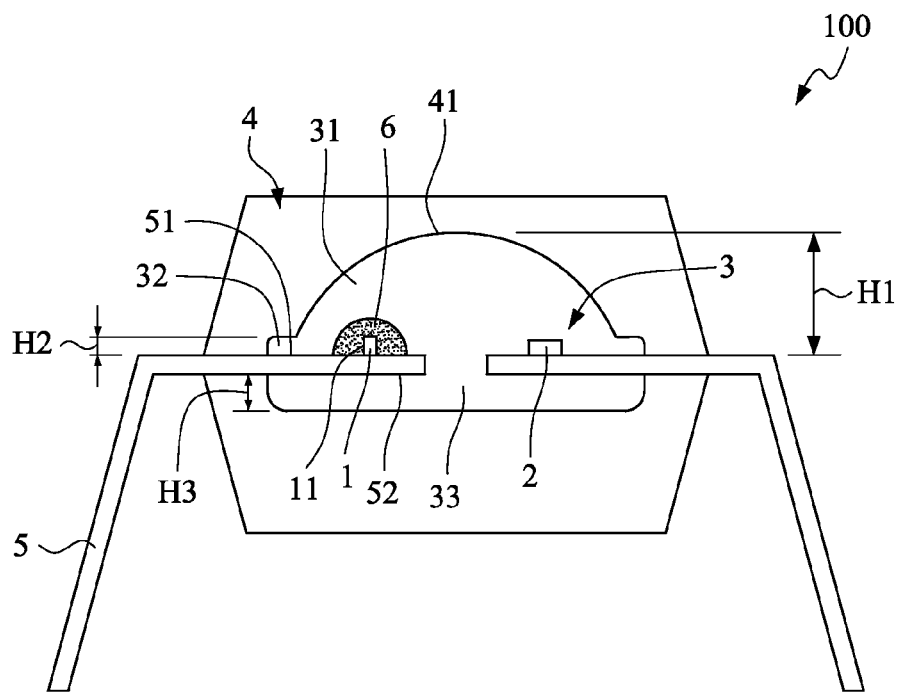
FIG. 1 is the first cross-section view illustrating a photocoupler according to an embodiment of the present invention.
Figure 2:
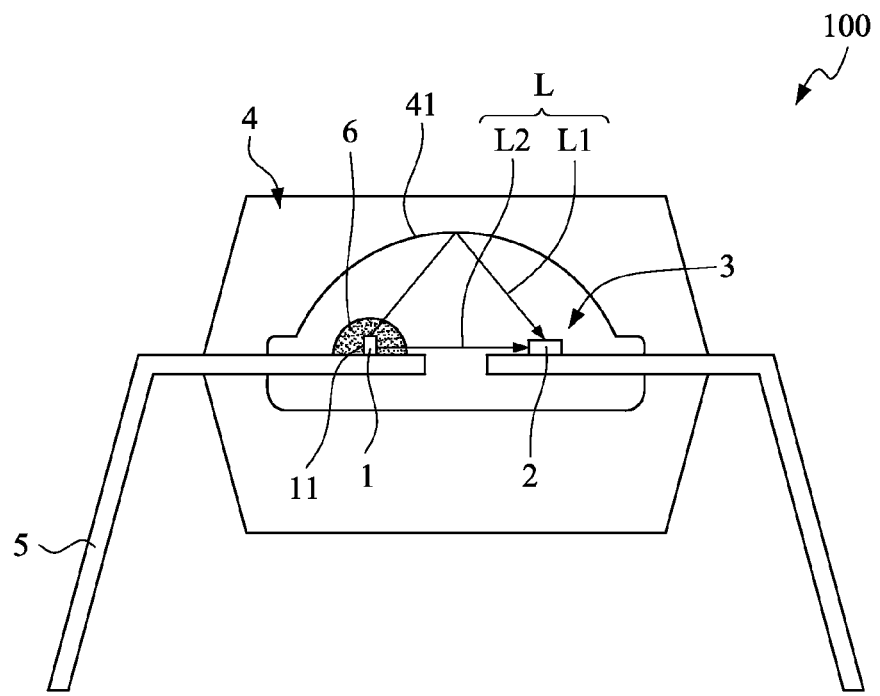
FIG. 2 is the second cross-section view illustrating the photocoupler according to the embodiment of the present invention.

As illustrated in FIG. 1, a photocoupler 100 of an embodiment according to the present invention includes a light emitting element 1, a light-sensing element 2, a transparent inner encapsulant body 3, an outer covering body 4, and two conductive frames 5.

The light emitting element 1 is used for emitting a light L and is provided on the conductive frame 5. The light emitting element 1, for example, is an infrared light emitting diode. It will be further appreciated that the light emitting element 1 can be replaced with other light emitting component, e.g. a visible light emitting diode, a laser light-emitting diode, or a plasma light emitting diode. The light-sensing element 2 is used for receiving the light L and is provided on the another conductive frame 5. The light-sensing element 2, for example, is a phototransistor for receiving the infrared light. It will be further appreciated that the light-sensing element 2 can be a photo resistor, a photodiode, a phototransistor, a silicon-controlled rectifier (SCR) or any other light-sensing component which is capable to convert a light signal to an electric signal.

The transparent inner encapsulant body 3 is provided with a dome encapsulant portion 31 and an extension encapsulant portion 32. The dome encapsulant portion 31 having a dome height H1 is for covering the light emitting element 1 and the light-sensing element 2. The extension encapsulant portion 32 having an extending height H2 smaller than the enclosed height H1 is extendedly formed from the dome encapsulant portion 31 in a direction from an optically reflective surface 41 of the outer covering body 4 radially outward. In the present embodiment, the extending height H2 of the extension encapsulant portion 32 is a fixed value, i.e. the extension encapsulant portion 32 horizontally extends from an outer curve margin of the optically reflective surface 41. However, the present invention is not limited to this. The extending height H2 can be variable, for example, in a way that a side portion of the extension encapsulant portion 32 is gradually lower toward outside. By means of the extension encapsulant portion 32, an internal creepage distance of the photocoupler 100 can be obtained with a value larger than or equal to 5mm. Specifically, the internal creepage distance is a shortest distance between two adjacent conductors across a inner surface of an insulating body. The internal creepage distance in the present invention can be deemed as a shortest distance between two conductive frames 5 across a contact surface between the extension encapsulant portion 32 and the outer covering body 4 to a contact surface between the dome encapsulant portion 31 and the outer covering body 4. The extension encapsulant portion 32 of the photocoupler 100 of the present invention is capable of increasing the internal creepage distance, and thus the photocoupler 100 can have an internal creepage distance that meets the safety regulation.

The outer encapsulant body 4 is for covering the transparent inner encapsulant body 3 by which the optically reflective surface 41 is formed on the outer encapsulant body 4 directly in contact with the dome encapsulant portion 31. As illustrated in FIG. 2, the light emitting element 1 and the light-sensing element 2 are allocated in a manner that both of them are facing the optically reflective surface 41 so that a first portion L1 of the light L emitting from the light emitting element 1 is reflected to a light receiving top portion of the light-sensing element 2 via the optically reflective surface 41, and a second portion L2 of the light L emitting from the light emitting element 1 is directly transmitting to a light receiving side portion of the light-sensing element 2 via the transparent inner encapsulant body 3 along a direction which parallels to two surfaces of the two conductive frames 5 on which the light emitting element 1 and the light-sensing element 2 are respectively mounted and the light-sensing element 2 is configured to sense the first portion L1 reflected from the optically reflective surface 41 and the second portion L2 parallel to the two surfaces of the two conductive frames 5. A surface of the light receiving top portion is parallel to the surfaces of the conductive frames 5. A surface of the light receiving side portion is perpendicular to the surfaces of the conductive frames 5. By means of the outer covering body 4, an external creepage distance of the photocoupler 100 of the present invention can be obtained with a value larger than or equal to 8 mm. Specifically, the external creepage distance is the distance between two adjacent conductors across an outer surface of an insulating body. The external creepage distance in the present invention can be deemed as a shortest distance between two conductive frames 5 across an outer surface of the outer covering body 4. The two conductive frames 5 extend from the transparent inner encapsulant body 3 to the outer covering body 4. Preferably, the interval distance between the two conductive frames 5 is in a range from 0.4 mm to 3 mm for meeting the safety regulations as required.

In addition, in the present embodiment, the material of the transparent inner encapsulant body 3 is epoxy resin. However, the material of the transparent inner encapsulant body 3 can be of any other transparent material. The material of the outer covering body 4 includes epoxy resin and $TiO_2$ so as to take an advantage of a white outer covering body 4. for reflecting the light L. However, the material of the outer covering body 4 is not limited to this, any other material capable of reflecting the light L can be chosen.

As illustrated in FIG. 1, the light emitting element 1 and the light-sensing element 2 are respectively provided on two first surfaces 51 of the conductive frames 5. A second surface 52 of the conductive frames 5 is provided with a flat base portion 33 formed of the same material of the dome encapsulant portion 31 and the extension encapsulant portion 32. The flat base portion 33 has a flat base height H3, which is smaller than the enclosed height H1 in order to minimize the volume of the transparent inner encapsulant body 3. Specifically, the surface of the light receiving top portion is parallel to the first surfaces 51 of the conductive frames 5, and the surface of the light receiving side portion is perpendicular to the first surfaces 51 of the conductive frames 5.

As illustrated in FIG. 1, a surface 11 of the light emitting element 1 is covered with a translucent sealant 6 for dissipating heat from the light emitting element 1. Specifically, the translucent sealant 6 is a material of silicone. However, the present invention is not limited to this. The translucent sealant 6 may be replaced with any other translucent material that is characterized with good heat dissipation.

The above description should be considered as only the discussion of the preferred embodiments of the present invention. However, a person skilled in the art may make various modifications to the present invention. Those modifications still fall within the spirit and scope defined by the appended claims.

What is claimed is:
1. A photocoupler, comprising:
 a light emitting element for emitting a light;
 a light-sensing element for receiving the light;
 a transparent inner encapsulant body having a dome encapsulant portion and an extension encapsulant portion, wherein the dome encapsulant portion having a dome height is provided to encapsulate the light emitting element and the light-sensing element in the dome encapsulant portion;

an outer covering body provided to cover the transparent inner encapsulant body, wherein an optically reflective surface is formed on the outer covering body directly in contact with a dome surface of the dome encapsulant portion; and two conductive frames on which the light emitting element and the light-sensing element are respectively mounted, wherein the two conductive frames are respectively extending out of the outer covering body from the transparent inner encapsulant body, wherein the extension encapsulant portion is extendedly formed from the dome encapsulant portion in a direction from the optically reflective surface radially outward with an extending height being smaller than the dome height, the light emitting element and the light-sensing element are provided as facing the optically reflective surface, a portion of the light emitting from the light emitting element is reflected to a light receiving top portion of the light-sensing element through the optically reflective surface, and the other portion of the light emitting from the light emitting element is directly emitting to a light receiving side portion of the light-sensing element through the dome encapsulant portion along a direction which is parallel to two surfaces of the two conductive frames on which the light emitting element and the light-sensing element are respectively mounted, the light-sensing element is able to sense the light parallel to the two surfaces of the two conductive frames and the light reflected from the optically reflective surface, a surface of the light receiving top portion is parallel to the surfaces of the conductive frames, and a surface of the light receiving side portion is perpendicular to the surfaces of the conductive frames.

2. The photocoupler as claimed in claim 1, wherein the light emitting element and the light-sensing element are respectively mounted on a first surface of the conductive frames, a second surface of the conductive frames is provided with a flat base portion formed of the same material as the dome encapsulant portion and the extension encapsulant portion, and the flat base portion has a flat base height smaller than the enclosed height.

3. The photocoupler as claimed in claim 1, wherein an external creepage distance of the photocoupler is larger than or equal to 8 mm.

4. The photocoupler as claimed in claim 1, wherein an internal creepage distance of the photocoupler is larger than or equal to 5 mm.

5. The photocoupler as claimed in claim 1, wherein an interval distance between the two conductive frames is in a range between 0.4 mm and 3 mm.

6. The photocoupler as claimed in claim 1, further comprising a translucent sealant for covering a surface of the light emitting element.

7. The photocoupler as claimed in claim 6, wherein the translucent sealant is formed of silicone.

8. The photocoupler as claimed in claim 1, wherein the light emitting element is an infrared light emitting diode.

9. The photocoupler as claimed in claim 1, wherein the extending height is a fixed value.

* * * * *

UNITED STATES PATENT AND TRADEMARK OFFICE
CERTIFICATE OF CORRECTION

PATENT NO. : 9,685,578 B2  
APPLICATION NO. : 14/068498  
DATED : June 20, 2017  
INVENTOR(S) : Poh-Loong Chew Page 1 of 1

It is certified that error appears in the above-identified patent and that said Letters Patent is hereby corrected as shown below:

On the Title Page

In (72) Inventor, change "Poh-Loong Chew, Grand Cayman (MY)" to --Poh-Loong Chew, Grand Cayman (KY)--.

Signed and Sealed this
Twenty-third Day of January, 2018

Joseph Matal
*Performing the Functions and Duties of the*
*Under Secretary of Commerce for Intellectual Property and*
*Director of the United States Patent and Trademark Office*